Figure 2:
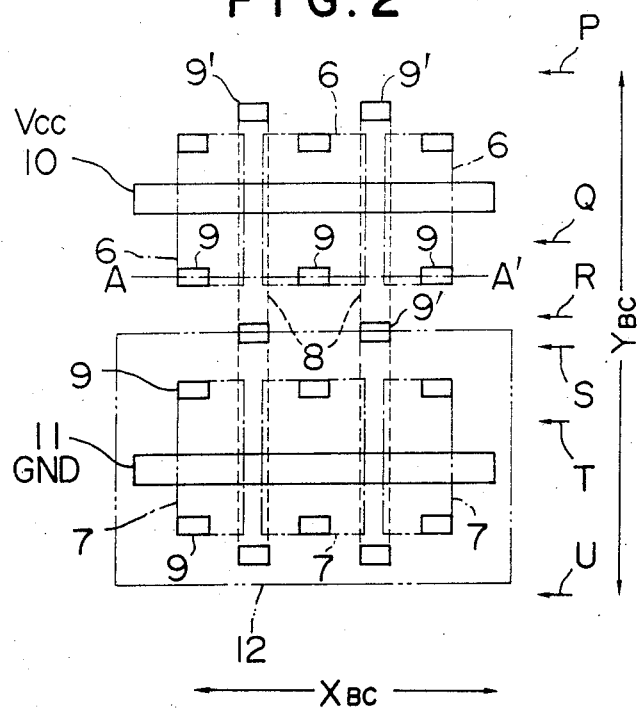

United States Patent [19]

Kuboki et al.

[11] Patent Number: 4,589,007
[45] Date of Patent: May 13, 1986

[54] SEMICONDUCTOR INTEGRATED CIRCUIT DEVICE

[75] Inventors: Shigeo Kuboki, Nakaminato; Mitsuhiro Ikeda, Hitachi; Akihiko Takano, Kamakura; Yoji Nishio; Ikuro Masuda, both of Hitachi, all of Japan

[73] Assignees: Hitachi, Ltd.; Hitachi Engineering Co., Ltd., both of Tokyo, Japan

[21] Appl. No.: 529,764

[22] Filed: Sep. 6, 1983

[30] Foreign Application Priority Data

Sep. 6, 1982 [JP] Japan ................................ 57-153921

[51] Int. Cl.⁴ .......................................... H01L 27/10
[52] U.S. Cl. ........................................ 357/45; 357/41; 357/42
[58] Field of Search .............................. 357/42, 41, 45

[56] References Cited

U.S. PATENT DOCUMENTS

| 3,943,551 | 3/1976 | Skorup | 357/42 |
| 3,999,214 | 12/1976 | Cass | 357/41 |
| 4,412,237 | 10/1983 | Matsumura et al. | 357/42 |

FOREIGN PATENT DOCUMENTS 58-97847  6/1983  Japan ................................ 357/42

Primary Examiner—Andrew J. James
Assistant Examiner—E. Fallick
Attorney, Agent, or Firm—Antonelli, Terry & Wands

[57] ABSTRACT

A semiconductor integrated circuit device is disclosed. A plurality of unit cells, each having at least a basic transistor device formed on one main surface of a semiconductor substrate, are arranged in a line to form a unit cell line. At least two of such unit cell lines are arranged adjacent to and in parallel with each other to form a basic cell line. A plurality of such basic cell lines are arranged in parallel with each other with a wiring region of a predetermined width being interleaved between adjacent basic cell lines.

13 Claims, 21 Drawing Figures

F I G. 1
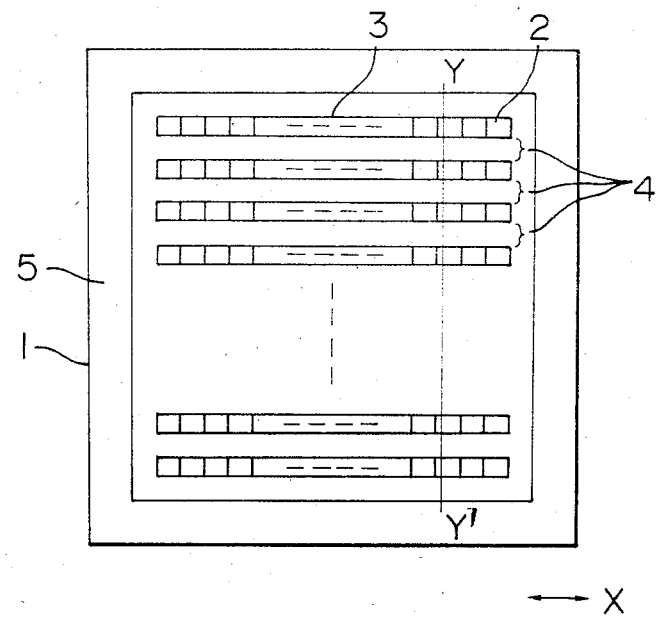
F I G. 4
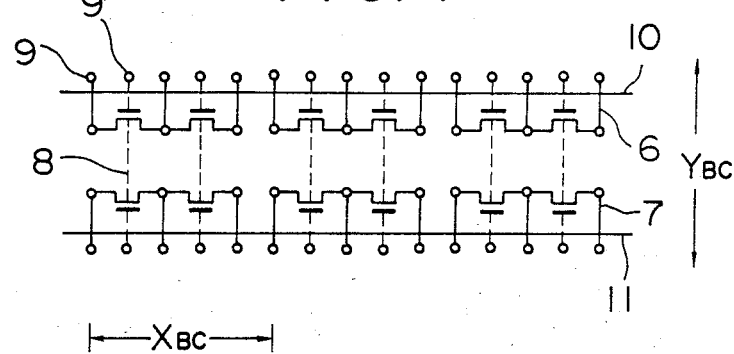

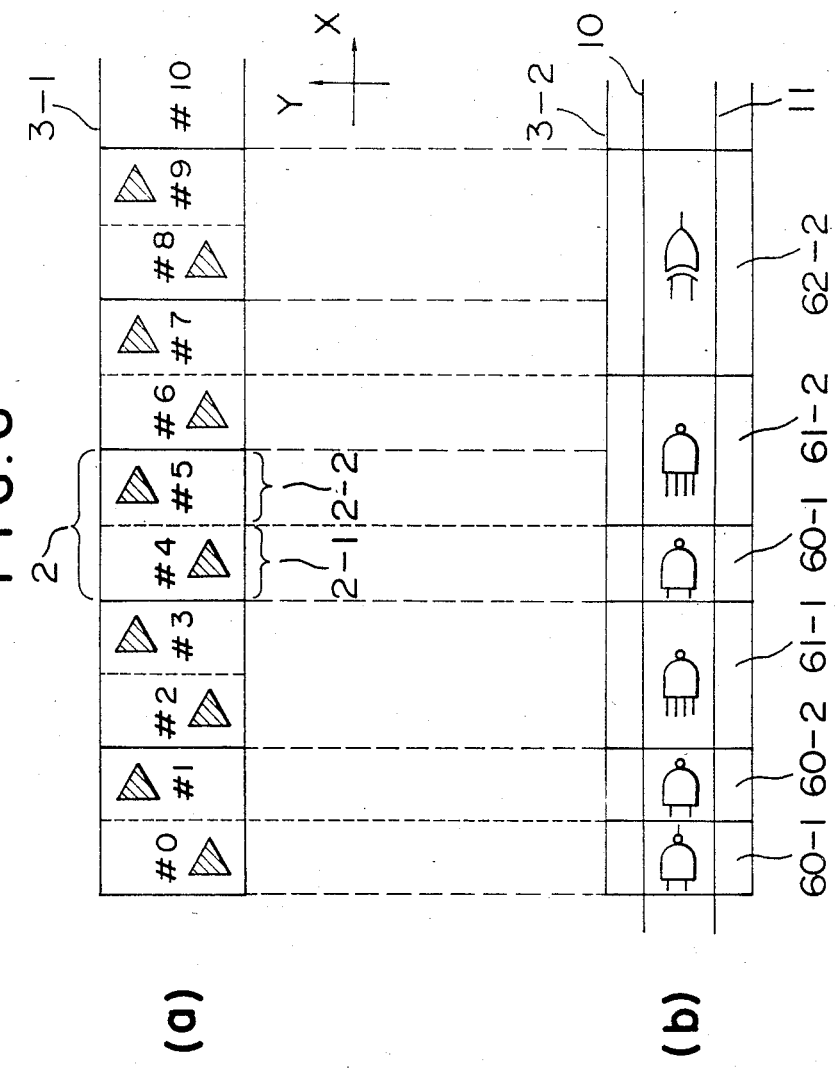

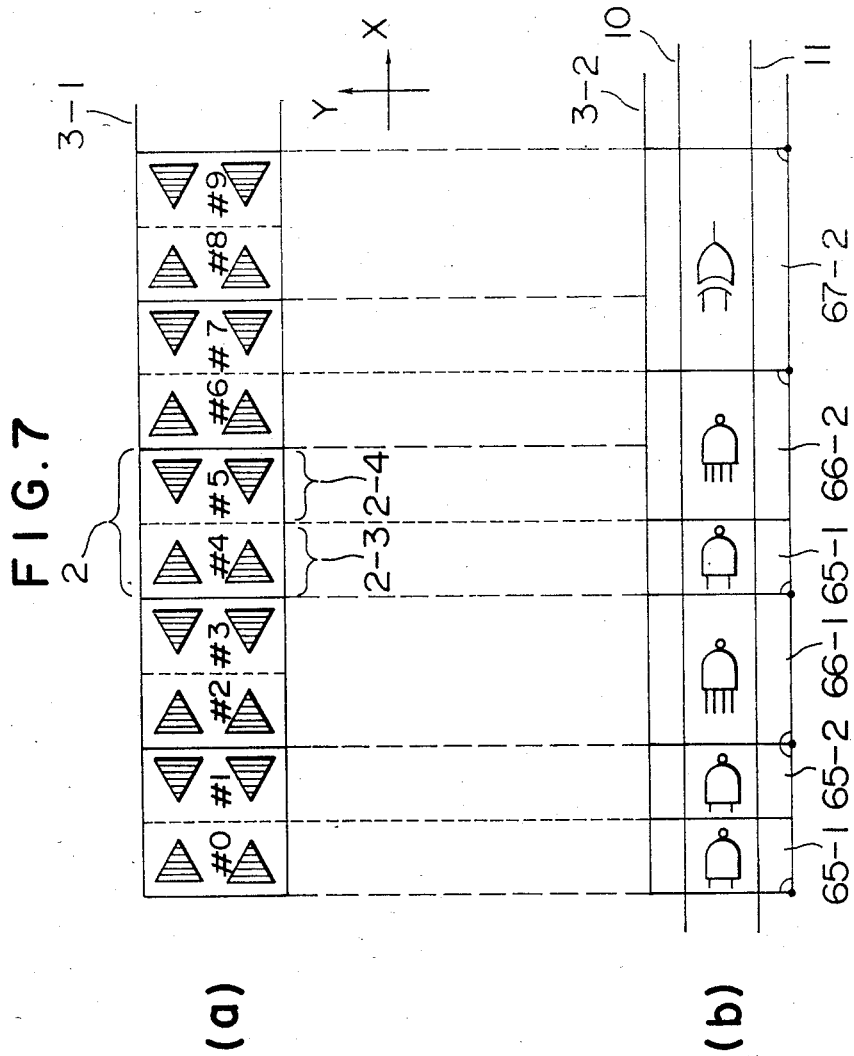

F I G. 15
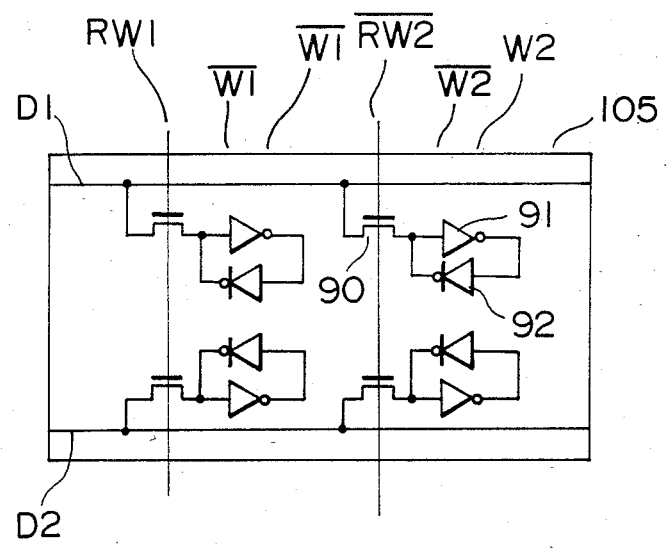

SEMICONDUCTOR INTEGRATED CIRCUIT DEVICE

The present invention relates to a semi-conductor integrated circuit device, and more particularly to a semi-custom LSI or a gate array LSI which can be made suitable for LSI devices of various types with only minor production changes still more particularly, it relates to a highly integrated gate array suitable for a memory such as a RAM or a register.

As disclosed in Japanese Patent Application Laid-Open No. 54-93375 (Japanese Patent Application No. 52-158445 filed Dec. 30, 1977), which corresponds to U.S. Pat. No. 4,412,237, in a master slice LSI, only those of ten or more maskes used to manufacture an LSI which are used as a wiring mask are prepared in accordance with a desired type to manufacture the LSI having a desired electrical circuit operation.

A structure of a prior art master slice LSI is shown in FIG. 1. An LSI chip 1 has a bonding pad and input/output circuit areas 5 on an outer periphery thereof, and basic cell lines 3 having basic cells 2 such as transistor devices arranged along an X-axis in an array, with wiring or interconnection areas 4 being interleaved therebetween. In order to achieve a desired electrical circuit operation, two or more adjacent basic cells 2 are connected to form a NAND gate or a flip-flop. Various logical gates each formed by a plurality of basic cells 2 are wired in accordance with a logic diagram to form an LSI.

FIG. 2 shows an example of the basic cell 2. The basic cell 2 comprises a P+-type region 6 which serves as a source or a drain of a P-channel MOS transistor, an N+-type region 7 which serves as a source or a drain of an N-channel MOS transistor, a P-type well region 12 formed in an N-type substrate to form the N+-type region 7, two poly-Si gate electrodes 8 which are shared by the P-channel and N-channel MOS transistors, a $V_{cc}$ power supply line 10 for supplying a power to the transistors, a GND power supply line 11, contact holes 9 for connecting the P+-type and N+-type diffusion layers 6 and 7 which serve as the source and the drain or vice versa with aluminum (Al) wires (not shown), and contact holes 9' for connecting the gate electrode 8 with an Al wire.

Figure 3A:
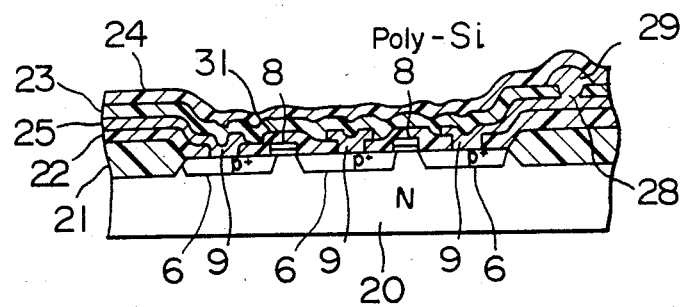
Figure 3B:
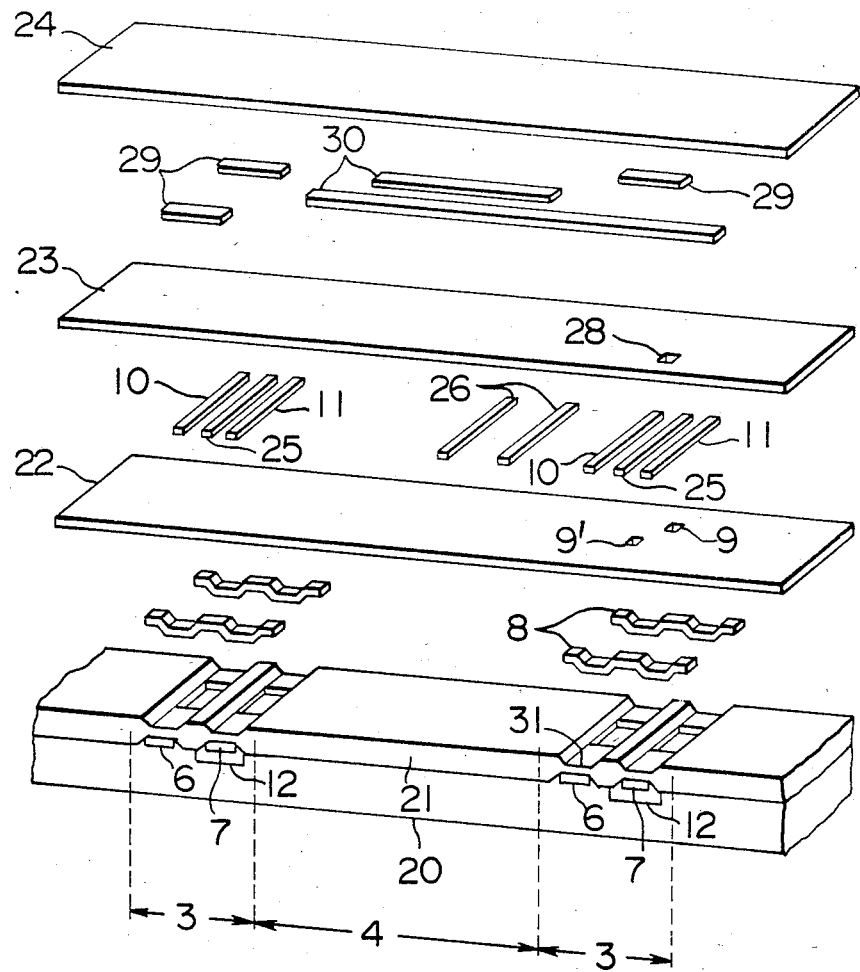

FIG. 3a shows a sectional view of the basic cell 2 taken along a line A—A', and FIG. 3b shows an exploded view of the structure of the wiring regions 4 taken along a line Y—Y' in FIG. 1 and the wiring layers. The like numerals to those shown in FIG. 2 designate the like or equivalent elements. Devices such as transistors are formed on one surface of an N-type substrate 20. A field oxide layer 21 is disposed on one surface of the substrate 20 and has a thickness of approximately 1 μm. A gate oxide film 31 is disposed under the gate electrode 8 of the transistor and has a thickness of 500–1000 Å. An insulation layer 22 is disposed on the poly-Si line forming the gate electrode 8, and first Al wiring lines including the power supply lines 10 and 11 and the Al wires 25 and 26 are formed on the insulation layer 22 in parallel with the cell lines (cell row). When it is desired to connect the poly-Si line 8 or the diffusion layers 6 and 7 to the first wiring lines, the contact holes 9 and 9'' are formed in the insulation layer 22. An insulation layer 23 is formed on the first wiring line layer, and second Al wiring lines 29 and 30 are formed thereon normally to the cell lines. When it is desired to connect the first wiring lines with the second wiring lines, a contact hole 28 is formed in the insulation layer 23. An insulation layer 24 is formed at the top to protect the transistor and the wiring lines. In a conventional gate array LSI, the insulation layer 23 having the contact holes 28 at areas necessary to connect the first wiring lines and the second wiring lines is altered by a selected mask for each type to attain a desired LSI. In other instances, the insulation layer 22 having the contact holes 9 and 9' at areas necessary to connect the first wiring lines to the poly-Si lines and the diffusion layers is also altered.

In such a prior art master slice system, the areas through which the wiring lines pass are fixed and the positions of the contact holes are at fixed intervals. In order to prevent the reduction of the packing density of the LSI, it is desirable to reduce the spacing between the contact holes as much as possible. As shown in FIG. 3a, there are steps at the boundary of the diffusion region 6 and the field oxide layer 21 and at the ends of the poly-Si electrode 8. If the contact holes 9 and 28 are formed in the steps, the wirings are easily broken. Since the step at the boundary of the diffusion region 6 and the field oxide layer 21 is large, the spacing of the contact holes is determined by the height of that step. This lowers the packing density and makes the wiring design quite difficult.

FIG. 4 shows the basic cell line including the basic cells shown in FIG. 2. They are represented by logical symbols, and identical or equivalent elements to those of FIG. 2 are designated by like numerals. It is desirable that the size of the basic cell (lateral dimension $X_{BC}$, longitudinal dimension $Y_{BC}$) is small in order to attain a high packing density.

$X_{BC}$ is determined by the pitch of the second metallizations or metallized wiring lines (hereinafter referred to as Al-2) and the number of MOS transistors arranged laterally, that is, a type of the logical gate formed by one basic cell. As shown in FIGS. 2 and 4, one basic cell normally forms a two-input NAND gate and $X_{BC}$ is as large as 5 pitches. On other hand, the $Y_{BC}$ is determined by a channel width of the MOS transistor and the number of channels of a block designing wiring (which usually uses Al-1 although Al-2 may be partially used). The channel width is determined by a gate delay required. In the prior art basic cell, 6 to 8 channels (Al-1 wiring throughs) are secured as shown by arrows P, Q, R, S, T and U in FIG. 2, but when a large scale arrangement having complex wirings such as a counter or a JK flip-flop is to be designed, 10 to 16 basic cells are arranged along the basic cell line and the number of off-cell wirings increases. The off-cell wirings are defined as wirings which are arranged off the block cells (All wiring area) because the wirings cannot be accommodated in the block. As a result, the channel width in the Al-1 wiring block must be sufficiently large. This causes an increase of the basic cell size and a decrease of the packing density.

Further, in the prior art basic cell, when regular cells such as RAM, ROM or PLA (programmed logic array) are to be formed, most areas of the wiring regions 4 are wasted and an area efficiency is low because the basic cells are not constructed to suit to a register or a memory and only address lines and data lines extend regularly and mutual connection of random gates is not necessary.

It is an object of the present invention to provide a master system for a gate array LSI which facilitates a design of a large scale block such as RAM, register or counter and enables a compact wiring design.

It is another object of the present invention to provide a master system for a gate array LSI which permits construction of desired circuits using the so-called variable block system (i.e. one functional logical gate per block). In this regard, it is an object to be able to efficiently form a small scale block such as a 2-input NAND block.

It is a further object of the present invention to provide a semiconductor integrated circuit device suitable to a gate array LSI which can form one of various circuits at a high packing density without wasting elements and wiring regions.

In accordance with a first aspect of the semiconductor integrated circuit device of the present invention, two or more unit cell lines each having a plurality of unit cells arranged in a line, each unit cell (corresponding to the aforementioned basic cell) having at least a basic transistor device fixedly formed on one main surface of a semiconductor substrate, are arranged adjacent to and in parallel to each other to form a basic cell line. Thus, the "basic cell line" of the present invention is actually formed of two or more unit cell lines, with each unit cell line being a one-row array of unit cells. Therefore, the basic cell lines of the present invention are each actually multi-line rows rather than the one-line rows of the prior art. A plurality of such basic cell lines are arranged in a direction normal to the basic cell line with a wiring region of a predetermined width being left between the adjacent basic cell lines.

In accordance with a second aspect of the semiconductor integrated circuit device of the present invention, a plurality of basic cells each having i first conductivity channel MOS transistors having sources or drains thereof connected in series and i+1 second conductivity channel MOS transistors having sources or drains thereof connected in series are arranged in a line to form a basic cell line, and a plurality of such basic cell lines are arranged on a semiconductor substrate in parallel to each other in a direction normal to the basic cell line, and a plurality of wiring layers are stacked one on the other on the semiconductor substrate for connecting the transistors in each basic cell, and the basic cells.

In accordance with a third aspect of the semiconductor integrated circuit device of the present invention, a plurality of semiconductor devices are formed on a main surface of a semiconductor substrate, a field insulation film is formed on the main surface except the areas of the semiconductor devices and a plurality of wiring layers are stacked one on the other on the semiconductor substrate with insulation films interposed therebetween. Contact holes are selectively formed in the insulation layers at crosspoints of the wirings to connect the elements in each semiconductor device and the semiconductor devices. A spacing between the adjacent crosspoints which cross the boundary of the semiconductor device and the field insulation layer is selected to be larger than a spacing between other crosspoints in order to avoid forming a contact hole near or on the boundary.

Figure 5A:
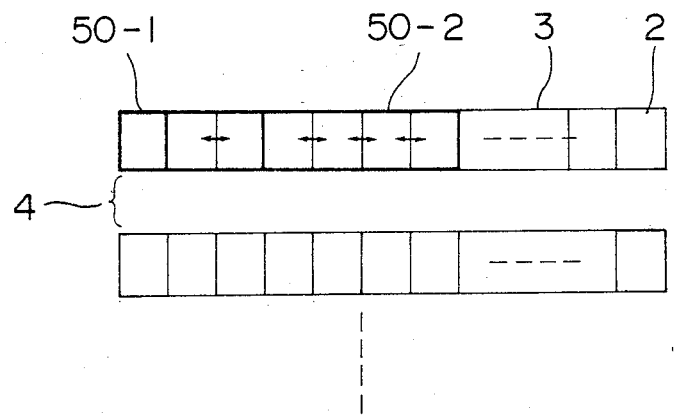
Figure 5B:
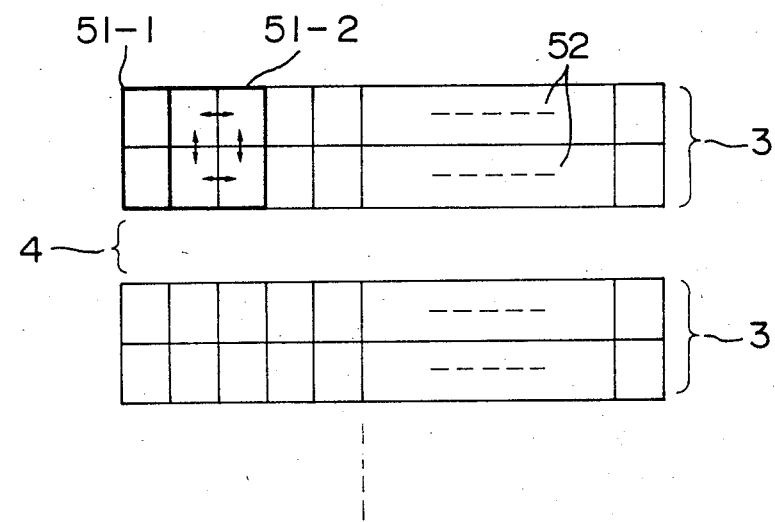
Figure 8A:
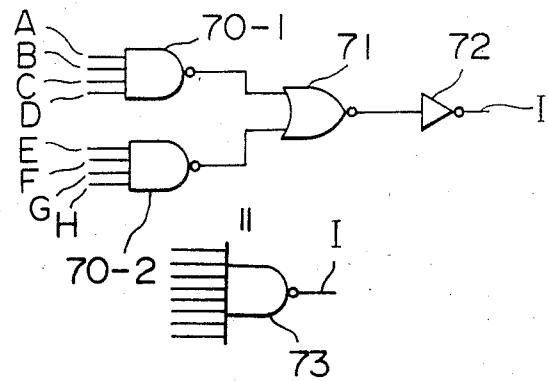
Figure 8B:
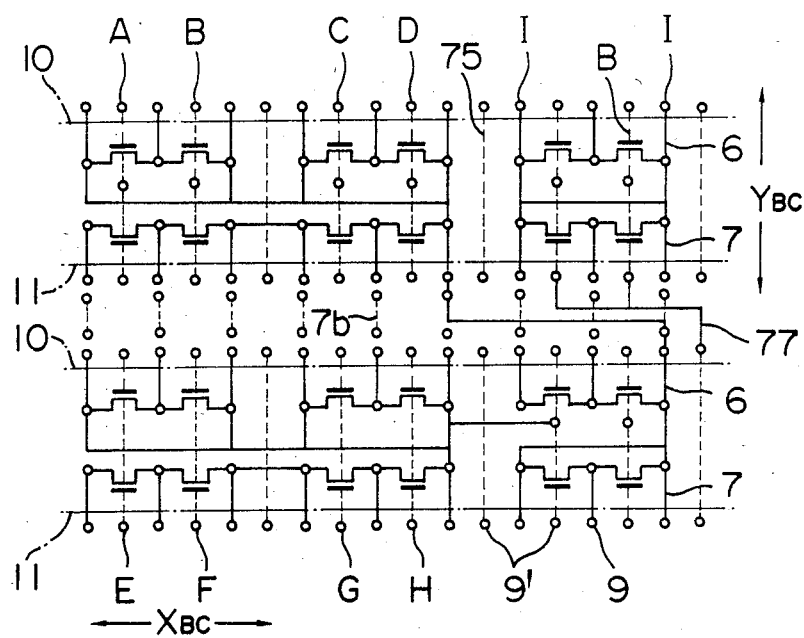
Figure 9A:
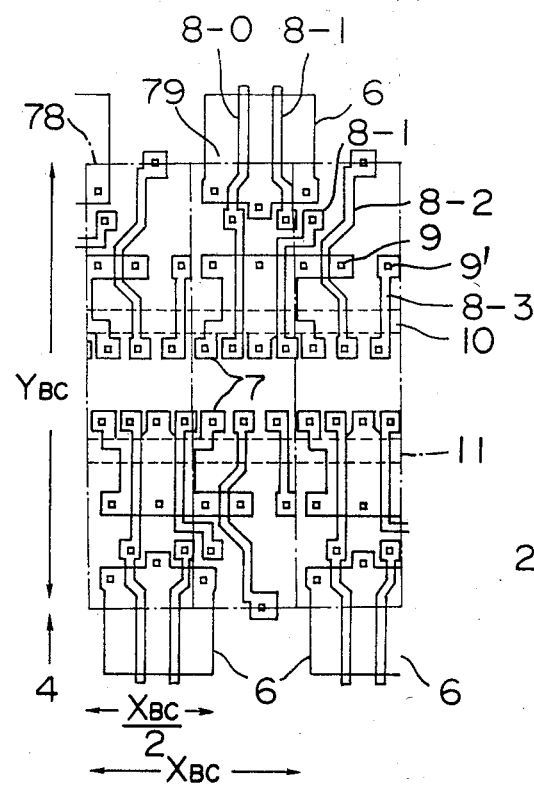
Figure 9B:
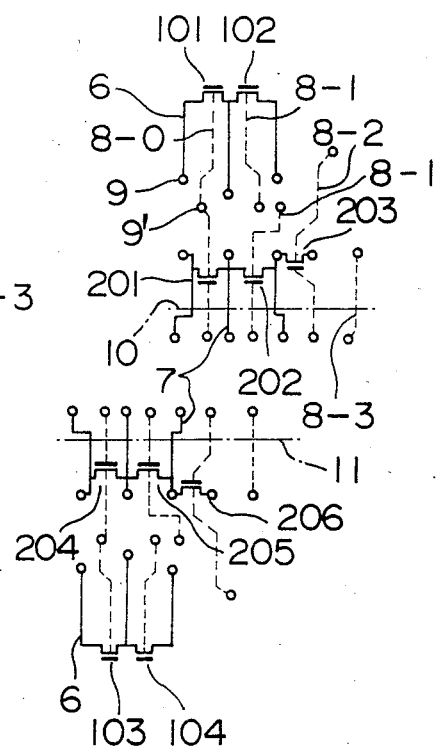
Figure 10:
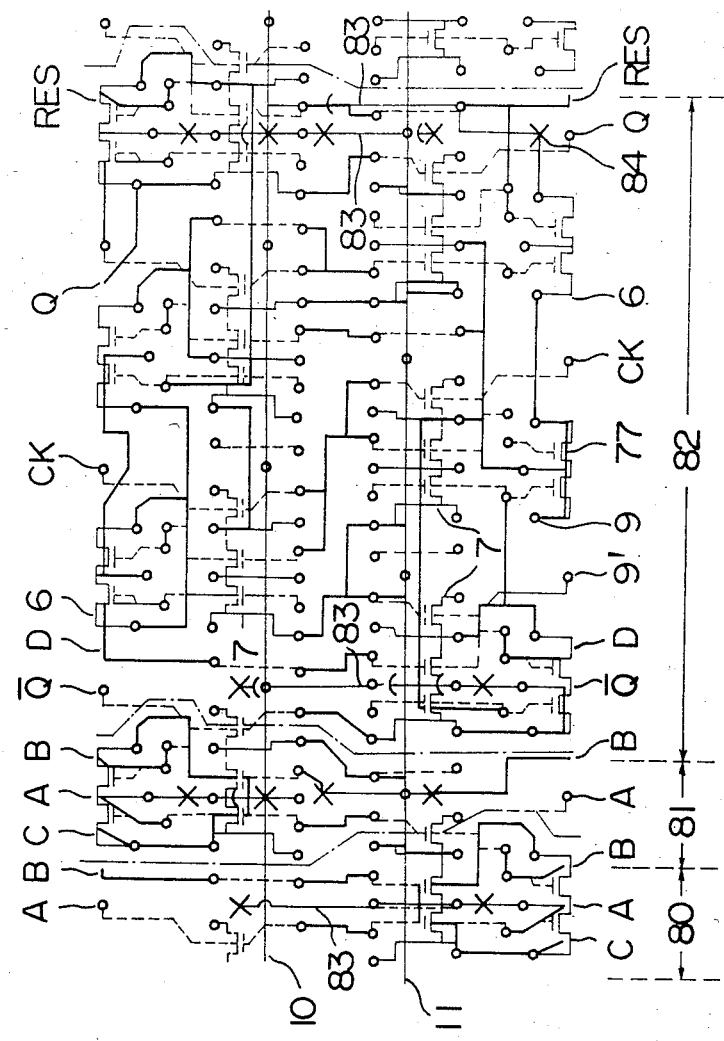
Figure 11:
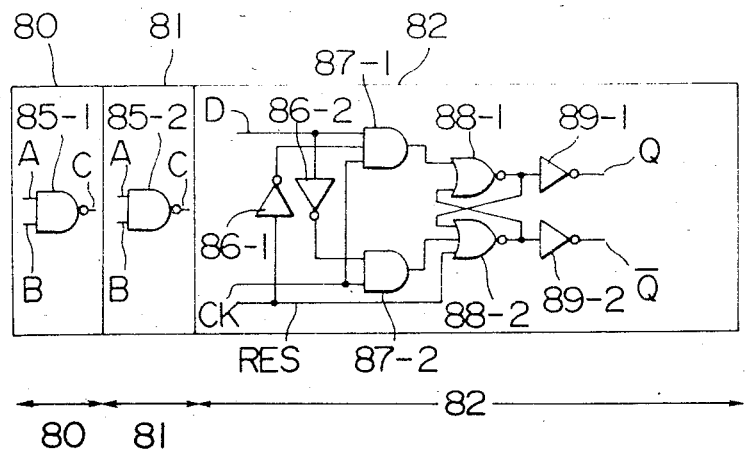
Figure 12:
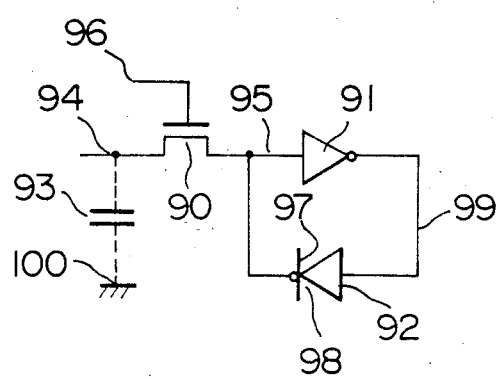
Figure 13:
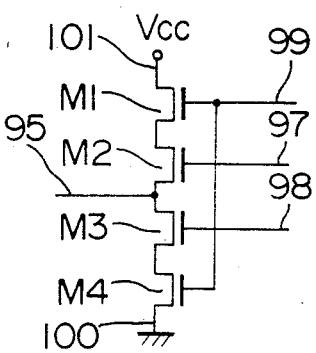
Figure 14:
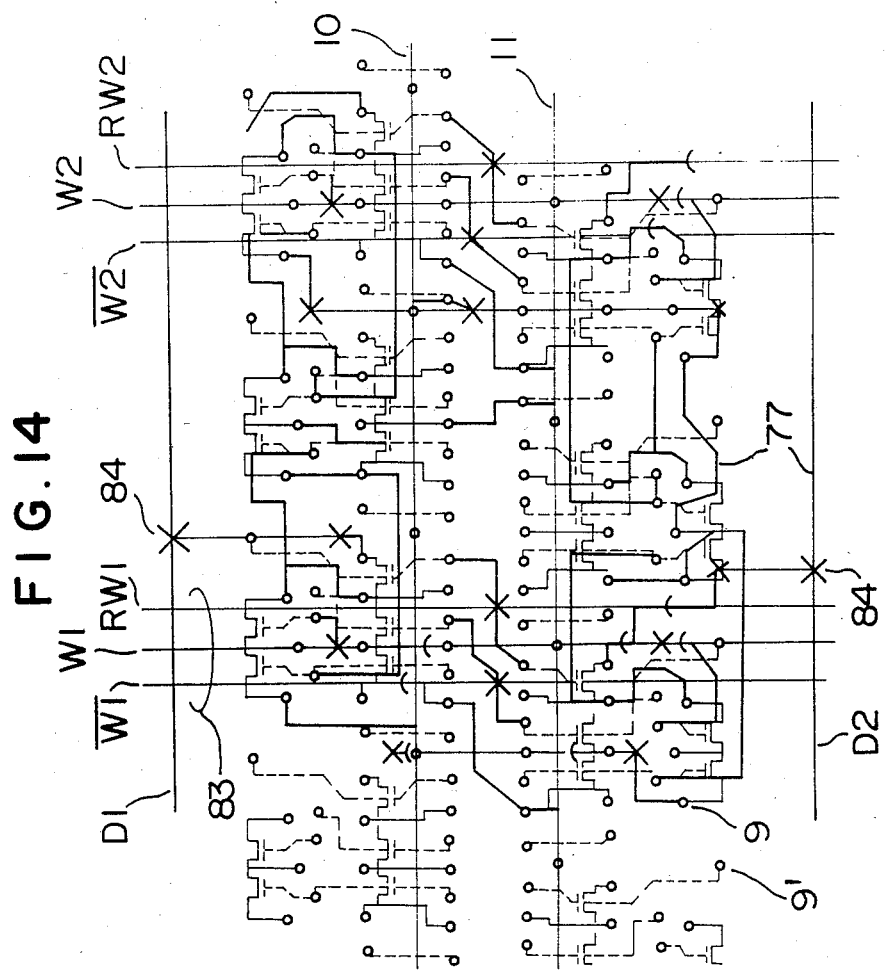
Figure 16:
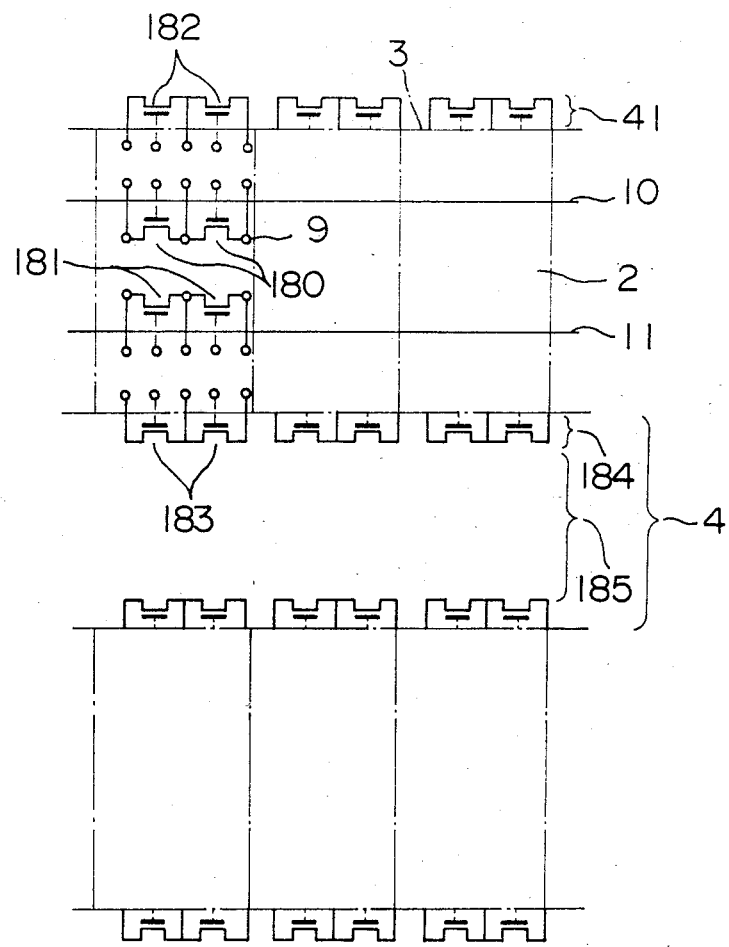
Figure 17:
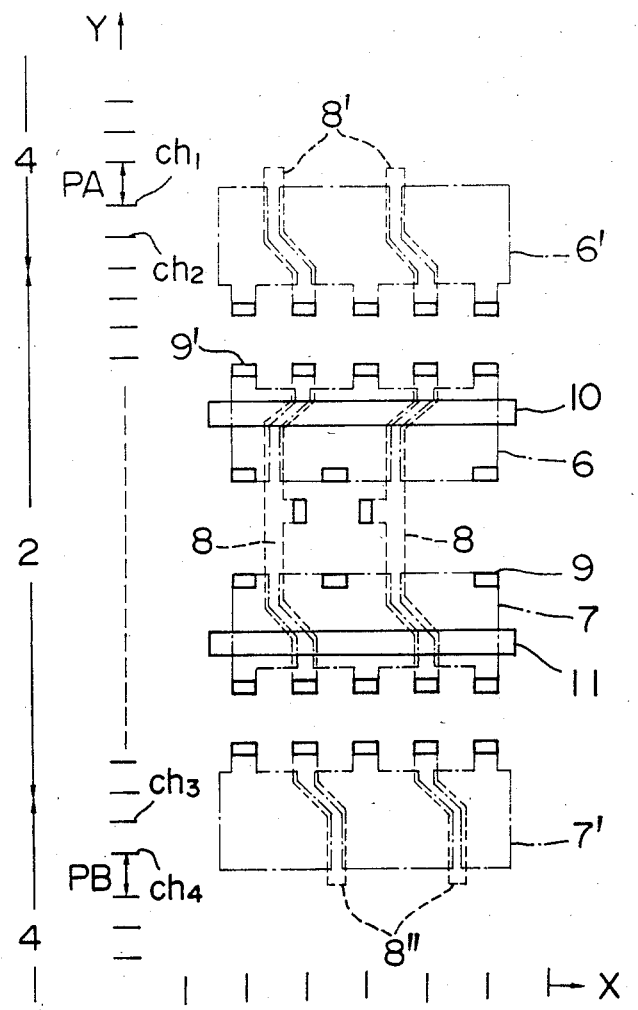

The present invention will be apparent from the following detailed description of preferred embodiments taken in conjunction with the accompanying drawings, in which:

FIG. 1 is a plan view of a prior art master chip,
FIG. 2 is a plan view of a prior art basic cell,
FIG. 3a is a sectional view of a prior art gate array LSI,
FIG. 3a is an exploded view for showing a layered structure of FIG. 3a,
FIG. 4 shows a circuit arrangement in a prior art master system,
FIGS. 5a and 5b illustrate a difference between the prior art master system and a master system in a first embodiment of the present invention,
FIG. 6 is a plan view for illustrating a master system in a second embodiment of the present invention,
FIG. 7 is a plan view for illustrating a master system in a third embodiment of the present invention,
FIGS. 8a and 8b show a circuit diagram and a configuration of a fourth embodiment of the present invention,
FIGS. 9a and 9b show a plan view and a configuration of a fifth embodiment of the present invention,
FIGS. 10 and 11 show a configuration and a symbolic diagram, respectively, of a logical block designed by using the basic cells of FIG. 9.
FIG. 12 shows a circuit diagram of one bit of a RAM,
FIG. 13 is a circuit diagram for explaining FIG. 12,
FIG. 14 shows a configuration of a RAM block,
FIG. 15 is a symbolic diagram of the RAM block, and
FIGS. 16 and 17 are plan views of a sixth embodiment of the present invention.

The present invention is now explained in detail with reference to the preferred embodiment EMBODIMENT 1 FIGS. 5a and 5b show configurations of masters to illustrate an effect of a two-line construction. The like or equivalent elements to those described previously are designated by like numerals (This same rule is applied throughout the specification unless noted otherwise.) FIG. 5a shows a prior art one-line master system, and FIG. 5b shows a two-line master system in accordance with a first embodiment of the present invention.

In the former, one basic cell usually forms a two-input NAND block 50-1. For a large scale block like a block 50-2, a number of basic cells must be combined. However, since the wiring of the basic cells is limited to the direction of the basic cell line as shown by arrows in FIG. 5a, the wiring in the block is very difficult to attain. It is apparent that the increase of the longitudinal dimension of the basic cell causes the increase of the chip size.

In FIG. 5b, it is seen that the basic cell line 3 is formed to have two lines of cells rather than one. In other words, in FIG. 5b, each "basic cell" is, in reality, two of the basic cells previously reffered to in FIG. 5a. Accordingly, for clarity, each individual cell will be referred to hereinafter when discussing the present invention as a "unit cell" (which corresponds to the aforementioned prior art basic cell 2 of, for example, FIGS. 2 and 5a). Thus, in FIG. 5b, the individual unit cells form two unit cell lines 52. These unit cell lines are combined to form a basic cell line 3. Background patterns of the adjacent unit cells may be the same or different from each other. For example, in FIG. 5a, the logical block 50-1 has one basic cell 2 and the logical block 50-2 has two basic cells 2. The logical block 51-2 in FIG. 5b comprises four unit cells and the wirings among the unit cells extend in four directions as shown by arrows so that the complexity of the wirings is relieved. An area margin (overhead) for extending the wirings to terminal positions on the block boundary is reduced to one half of that of FIG. 5(a) because the length of one functional logical block which faces the wiring region 4 in FIG. 5b is approximately one half of that in FIG. 5a. Accordingly, a large scale block such as RAM, register or counter can be constructed with a high area efficiency.

While a two-line master system has been described, it should be understood that a multi-line master system offers a similar effect. The present embodiment is particularly suitable to the RAM, ROM or register file where decode lines, address lines and intercell wirings extend regularly.

EMBODIMENT 2

The multi-line master system improves the area efficiency because it employs the basic cell background patterns which match to the function of the relatively large scale block such as RAMs or registers and the wirings thereof. On the other hand, in order to increase the gate utilization efficiency while maintaining one functional logical gate per basic cell, it is necessary to reduce the size of the logical block of the basic gate to be smaller than the size of the basic cell. A principle of operation to the approach thereto is now explained.

FIG. 6 shows a master construction in one approach. In FIG. 6(a), a numeral 3-1 denotes a basic cell line composed of basic cells 2. It shows a background pattern before metallization. In FIG. 6(b), a numeral 3-2 denotes a logical block cell line having wiring metallization applied to the background pattern. The basic cell 2 is designed such that sub-cells 2-1 and 2-2 divided by a line along the Y-axis are line symmetric with respect to the X-axis. That is, the sub-cells 2-1 and 2-2 have (symmetry, rotation) representations of (0, 0) and and (2, 0), respectively. For each logical function gate, two blocks for the sub-cells 2-1 and 2-2 are registered, and the former block is used for an even number sub-cell and the latter block is used for an odd number sub-cell. A series of numbers are shown in FIG. 6(a). Two types of blocks are required because the $V_{cc}$ and GND power supply lines 10 and 11 are fixed and hence the wiring patterns connected to those power lines must be altered. Usually, the blocks are automatically arranged by an arranging and wiring program and interblock wirings are also automatically wired. Since the basic gates such as two-input NAND's are automatically arranged block by block, the gate utilization efficiency is improved. FIG. 6(b) shows a result of the block arrangement. Numerals 60-1 and 60-2 denote two-input NAND block cells for the basic cells 2-1 and 2-2, respectively, numerals 61-1 and 61-2 denote four-input NAND blocks for the basic cells 2-1 and 2-2, respectively, and numeral 62-2 denotes an EXCLUSIVE-OR (EOR) gate for the basic cell 2-2.

EMBODIMENT 3

FIG. 7 shows a third embodiment of the present invention, in which the like or equivalent elements to those shown in FIG. 6 are designated by the like numerals. FIG. 7(a) shows a basic cell line 3-1 (background pattern) consisting of the basic cells 2, and FIG. 7(b) shows a cell line 3-2 of a logical block.

The basic cell 2 is designed such that sub-cells 2-3 and 2-4 divided by a line along the Y-axis are line symmetric with respect to the Y-axis. That is, the sub-cells 2-3 and 2-4 are in a relation of (0, 0) and (2, 2). The block for the sub-cell 2-3 is registered and it is arranged as it is for an even number sub-cell, and the block is symmetrically rotated, that is, it is folded with respect to the Y-axis for an odd number block. A series of numbers are shown in FIG. 7(a).

The block cell line 3-2 shows an example of arrangement. Numerals 65-1 and 65-2 denote two-input NAND blocks having symmetry and rotation representations of (0, 0) and (2, 2), respectively, numerals 66-1 and 66-2 denote four-input NAND blocks of similar relation, and numeral 67-2 denotes an EOR gate block after (2, 2) conversion. In the present embodiment, only one block may be registered for each same logical gate.

While the basic cell patterns having specific rotation and symmetry relations when divided into sub-cells have been described in the Embodiments 2 and 3, the present invention is equally applicable to the basic cell pattern having similar rotation and symmetry relations among subcells when the cell is divided into a plurality of sub-cells. In this case, the size of the sub-cells is equal to that of a minimum basic gate block.

EMBODIMENT 4

FIGS. 8a and 8b show a fourth embodiment of the present invention. FIG. 8b shows an eight-input NAND gate and FIG. 8b shows a block diagram of the gate of FIG. 8b implemented by the master of the present invention.

An eight-input NAND 73 has inputs A, B, C, D, E, F, G and H and an output I and it is decomposed to four-input NAND's 70-1 and 70-2, a two-input NOR 71 and an inverter 72. When the eight-input NAND is directly constructed, it has a high logical threshold and is not desirable. Accordingly, it is usually designed in the decomposed form. A master shown in FIG. 8b has two parallel lines of the basic cell line shown in FIG. 4. Poly-Si underpaths 75 are arranged between ganged P-channel or N-channel MOS transistors, and poly-Si 76 for through-connections is arranged between the first stage and the second stage. A thick solid line 77 is the Al-1 wiring. FIG. 8b shows a block wiring pattern for the eight-input NAND. A-I denote input/output terminals which correspond to those shown in FIG. 8a.

EMBODIMENT 5

A plan view of a basic cell in accordance with a fifth embodiment of the present invention is shown in FIG. 9a and a circuit diagram thereof is shown in FIG. 9b.

Numeral 6 denotes a P+-type diffusion layer which forms a source or drain electrode of a PMOS transistor 101, 102, 103 or 104, numeral 7 denotes an N+-type diffusion layer which forms a source or drain electrode of an NMOS transistor 201, 202, 203, 204, 205 or 206, numerals 8-0, 8-1 and 8-2 denote poly-Si gate electrodes, numeral 8-3 denotes a poly-Si underpath, numeral 9 denotes a contact hole in the diffusion layer, numeral 9' denotes a contact hole in the poly-Si, and numerals 10 and 11 denote $V_{cc}$ and GND power supply lines formed by first wiring lines with oxide layers interleaved therebetween. The basic cell is defined by a dimension $X_{BC}$ and a dimension $Y_{BC}$. It comprises two unit cell lines each having two ganged PMOS's 101 and 102 which share the source or drain, three ganged NMOS's 201, 202 and 203 which share the source or drain and the poly-Si underpath 8-3, and the unit cell lines are arranged adjacent to and in opposing relation to each other with the unit cell lines being staggered from each other in the X-axis direction by $X_{BC}/2$. Thus, the unit cells are arranged in a zigzag pattern. Accordingly, when the basic cell is divided by a line along the Y-axis, the sub-cells 78 and 79 are symmetric with respect to the X-axis.

Because of the zigzag arrangement, the two poly-Si 8-2 and 8-3 can be used as throughs to extend equipotential plane terminals when a conventional gate block is formed. When a RAM block is formed, the poly-Si 8-2 is used as the gate electrodes of the small size NMOS transistors 203 and 206 (components of the RAM). The NMOS transistors 203 and 206 are of approximately one third in size of the other NMOS transistors 201, 202, 204 and 205 and have small gate capacitances and can be used as throughs.

The PMOS transistor 101 and the NMOS transistor 201, and the PMOS transistor 103 and the NMOS transistor 204 share the gate electrodes 8-0, respectively, and the PMOS transistor 102 and the NMOS transistor 202, and the PMOS transistor 104 and the NMOS transistor 205 have their gate electrodes 8-1 isolated.

By isolating the gate electrodes of the PMOS and NMOS transistor pairs, it is easier to construct a clocked inverter.

The power supply lines 10 and 11 extend over the inner NMOS transistors 201, 202, 203, 204, 205 and 206. (The power is fed to the MOS transistors by the Al-1 as well as by the Al-2.) Since the contact holes in the drain or source electrodes of the outer PMOS transistors 101, 102, 103 and 104 are offset toward the center of the basic cell, portions of the areas of the PMOS transistors 101, 102, 103 and 104 can be used as the wiring region 4 and the basic cell size can be reduced.

Examples of logical gates constructed by using the master of FIGS. 9a and 9b are now explained. FIG. 10 shows a configuration of interblock wiring and FIG. 11 shows a symbolic diagram of the block.

In FIG. 10, a thick solid line 77 shows the Al-1 wiring, a normal solid line 83 shows the Al-2 wiring, X 84 shows the contact hole for connecting the Al-1 and Al-2 wirings, and a chain line shows a boundary of blocks on a layout. The background basic cell occupies six pitches and a minimum logical block (two-input NAND) occupies three pitches. (Dots in a grid pattern are arranged at one pitch.) The Al-2 wiring 83 starts at X 84 and ends at X 84.

Regions 80 and 81 are blocks for the two-input NAND's at an even number position and an odd number position. Region 82 is a block for a D-type flip-flop at the even number position. It comprises six gates of two-input NAND equivalence. A, B, C, D, CK, RES, Q and $\overline{Q}$ denote input/output terminals which correspond to those shown in FIG. 11. As shown in FIG. 10, the off-cell Al-2 wirings are one for the two-input AND and three for the D-type flip-flop and an equipotential surface is secured. The D-type flip-flop comprises inverters 86-1, 86-2, 89-1 and 89-2, AND gates 87-1 and 87-2 and NOR gates 88-1 and 88-2. "1" is latched in the flip-flop comprising the NOR gates 88-1 and 88-2 when the data input D is "1", and "0" is latched when the data input D is "0", at a timing of CK="1".

A RAM block is next described. FIG. 12 shows one bit of a RAM. Numeral 90 denotes an NMOS transistor, numeral 91 denotes an inverter, numeral 92 denotes a clocked inverter, numeral 93 denotes a load capacitor of a data bus line 94, numeral 100 denotes a ground and numeral 96 denotes a read/write signal. The clocked inverter 92 is explained below. FIG. 13 shows a circuit of the clocked inverter which comprises NMOS transistors M3 and M4 and PMOS transistors M1 and M2. Numeral 100 denotes ground and numeral 101 denotes a $V_{cc}$ power supply line. Numeral 97 denotes a write enable signal, numeral 98 denotes an inverted signal of the write enable signal 97, and numeral 99 denotes a data input. When the write enable signal 97 is at an H-(high) level (signal 98 is at an L-(low) level), an output 95 is off, that is, in a high impedance state without regard to the data input 99 because the NMOS transistor M3 and the PMOS transistor M2 are off. On the other hand, when the write enable signal 97 is at the L-level (signal 98 is at the H-level), both the NMOS transistor M3 and the PMOS transistor M2 are on and the output 95 is the inversion of the data input 99.

In the circuit of FIG. 12, the data is written when the write enable signal 97 is at the H-level and the read/write signal 96 is at the H-level. At this time, the clocked gate 92 is off and the loop is disconnected, and the data on the data bus line 94 is written in the parasitic capacitors of the lines 95 and 99. After the write operation, the signals 96 and 97 return to the L-level. The data is held in the loop formed by the inverter 91 and the clocked inverter 92. This data is read out to the data bus line 94 when the read/write signal 96 is at the H-level (write enable signal 97 remains at the L-level) and the signal level on the line 95 charges or discharges the capacitor 93.

In order to prevent the inversion of the stored data in the read operation, it is necessary to design a channel ratio of the MOS transistor 90 to be small (on-resistance to be large), because if the signal is read when the line 95 is at the H-level and the line 94 is at the L-level, the level of the signal on the line 95 is lowered because it is divided by the PMOS transistors M1 and M2 and the series resistor of the NMOS transistor 90. When the level before the read operation is opposite to the above, it is necessary that the on-resistance of the NMOS transistor 90 is large by the same reason as described above.

FIG. 14 shows a wiring diagram of the RAM block and FIG. 15 shows a symbolic chart thereof. The present block is a 2 bits by 2-words RAM connected to data bus lines D1 and D2 (Al-1 wiring). One word is controlled by a read/write signal RW1, a write enable signal W1 and an inverted signal $\overline{W1}$ thereof, and the other word is controlled by a read/write signal RW2, a write enable signal W2 and an inverted signal $\overline{W2}$ thereof. Those six decode lines extend normally to the basic cell line and are wired by the Al-2.

In FIG. 14, the wiring rule and the numerals are identical to those of FIG. 10. The data bus lines D1 and D2 extend on the opposite sides of the basic cell line, or the field oxide layer and are wired by the Al-1. The six decode lines extend regularly in the normal direction to the basic cell line and are wired by the A12.

In the present embodiment, the RAM block comprises the six gate and one bit of the RAM is formed by only 1.5 gates (0.75 basic cell) of two-input NAND equivalence. Thus, the packing density can be improved.

For the memory circuit, the small NMOS transistors 203 and 206 are used as shown in FIG. 14, but for the logical block consisting of only NAND gates and NOR gates, the small NMOS transistors 203 and 206 are not used. In this case, the gate electrodes 8-2 of the NMOS transistors 203 and 206 are used as the wiring underpath like the underpath 8-3 so that the wiring in the logical block is facilitated. Thus, those transistors are effectively used as the transistors in the memory and as the underpaths in other devices.

While the two ganged PMOS transistors and the three ganged NMOS transistors are shown in the present embodiment, two NMOS transistors and three PMOS transistors may be used, or three ganged PMOS transistors and four ganged NMOS transistors or three NMOS transistors and four ganged PMOS transistors may be used in the present invention.

EMBODIMENT 6

A sixth embodiment of the present invention is shown in FIG. 16. A number of basic cells 2 each having two pairs of P-type and N-type MOS transistors 180 and 181 arranged on one main surface of a semiconductor substrate are arranged along the X-axis to form a basic cell line 3, and a plurality of such basic cell lines 3 are arranged in parallel in spaced relation from each other in the Y-direction. Two PMOS transistors 182 and two PMOS transistors 183 are arranged for each basic cell 2 between the basic cell lines 3 (channel region 4). The wiring channel 4 includes a buried device region 184 and a region 185 on a field oxide layer.

FIG. 17 shows a plan view of the pattern of the basic cell 2. The like elements to those shown in FIGS. 2 and 9 are designated by the like numerals. A pitch scale of the contact hole is shown at the bottom (X-axis) and on the left (Y-axis). In the prior art, the pitches in the X and Y directions are uniform but in this embodiment the pitch in the Y direction is increased at portions PA and PB which cross the boundaries of the diffusion layers 6' and 7' of the PMOS transistors 182 and 183 to eliminate contact inhibit points.

In the present embodiment, the cell boundary is shown by arrows of the basic cell 2, and the wirings on the PMOS transistors 182 and 183 are shown by ch1, ch2, ch3 and ch4. In the present embodiment, the size of the PMOS transistors 182 and 183 is equal to the size of the PMOS transistor 180 and the NMOS transistor 181. However, the size of the transistors 180 and 181 may be larger in order to emphasize the effect of the wiring on the PMOS transistors 182 and 183. In this case, the speed of the gate formed by combining the PMOS transistors 182 and 183 is improved.

As described above, the PMOS transistors 182 and 183 have no significant effect to the cell size and the RAM or the register can be very efficiently packaged by combining the MOS transistors 180 and 181. One basic cell can form two-input NAND gates. Thus, by parallelly connecting those gates when a high speed is required, an effective package density is improved.

While the gate array of the two-layer Al structure has been described, it should be understood that the wiring structure of three or more layers can be used without sacrificing the effect.

According to the present invention, the master system which enables easy fabrication of the large scale and complex block, such as RAM, register or JK flip-flop, in a compact size is provided. For the small scale block for the basic gate, such as two-input NAND, only one gate per block is required and the gate can be used efficiently and without waste.

Accordingly, the present master system provides the gate array having the high area efficiency to both the large scale block and the small scale basic block.

We claim:

1. A semiconductor integrated circuit device utilizing a plurality of unit cells each having at least a basic transistor device formed in one main surface of a substrate, said unit cells being formed into unit cell lines each having a plurality of unit cells arranged in a line in a predetermined direction, said device comprising:
    a plurality of basic cell lines arranged in parallel to each other on said semiconductor substrate, with a wiring region of a predetermined width being interleaved between adjacent basic cell lines, wherein each of said basic cell lines is formed of at least two of said unit cell lines arranged adjacent to and in parallel to each other, and further wherein each basic cell of said basic cell line is comprised of at least two of said unit cells,
    wherein the unit cells in adjacent ones of said unit cell lines are offset from one another along the direction of said basic cell line.

2. A semiconductor integrated circuit device comprising:
    a semiconductor substrate having a plurality of first unit cell lines arranged in parallel to each other,
    said first unit cell lines each having a plurality of first unit cells arranged in a line,
    said first unit cells each having i first conductivity channel MOS transistors having sources or drains thereof connected in series and i+1 second conductivity channel MOS transistors having sources or drains thereof connected in series, arranged on one main surface of said semiconductor substrate so that the number of second conductivity channel MOS transistors is greater than the number of first conductivity channel MOS transistors in each of said first unit cells; and
    a plurality of wiring layers stacked on said semiconductor substrate with insulation layers being interposed therebetween, for connecting elements in each of said first unit cells and connecting said first unit cells.

3. A semiconductor integrated circuit device according to claim 2 wherein said i first conductivity channel MOS transistors and ones of said (i+1) second conductivity channel MOS transistors except the (i+1) th second conductivity channel MOS transistors are arranged so as to make pairs in an opposite positional relation to each other and make the direction of the gate electrodes of the paired transistors correspond to that normal to the first unit cell line, and wherein the size of the second conductivity channel MOS transistor which is not paired with the first conductivity channel MOS transistor is smaller than the sizes of other MOS transistors.

4. A semiconductor integrated circuit device according to claim 2 wherein said i first conductivity channel MOS transistors and ones of said (i+1) second conductivity channel MOS transistors except the (i+1) th second conductivity channel MOS transistors are arranged so as to make pairs in an opposite positional relation to each other and make the direction of the gate electrode of the paired transistors correspond to that normal to the first unit cell line, and wherein a gate electrode of the second conductivity channel MOS transistor which is not paired with the first conductivity channel MOS transistor is used as an underpath.

5. A semiconductor integrated circuit device according to claim 2 further comprising a plurality of second unit cell lines arranged in parallel with said first unit cell lines wherein each of said second unit cell lines is composed of unit cells each having i+1 first conductivity channel MOS transistors having sources and drains thereof connected in series and i second conductivity channel MOS transistors having sources or drains thereof connected in series, arranged on one main surface of said semiconductor substrate so that the number of first conductivity channel MOS transistors is greater than the number of second conductivity channel MOS transistors in each of said second unit cells, wherein said second unit cell lines are arranged so that each second unit cell line is directly adjacent to a first unit cell line so that each pair of first and second unit cell lines forms a basic cell line of basic cells each comprised of said first and second unit cells, and further wherein said device comprises a plurality of said basic cell lines spaced apart from one another on said substrate with a wiring region of a predetemined width interleaved between adjacent basic cell lines.

6. A semiconductor integrated circuit device according to claim 5 wherein the first unit cells and the second cells are arranged within said basic cell line to be offset with relationship to one another along the direction of said basic cell line.

7. A semiconductor integrated circuit device according to claim 2 wherein in each unit cell either sources or drains of said first conductivity transistors are formed in a common diffused region and either sources or drains of said second conductivity transistors are formed in a common diffused region.

8. A semiconductor integrated circuit device according to claim 2 wherein the gate electrode of at least the i-th first conductivity channel MOS is separated from the gate electrode of the i-th second conductivity channel MOS transistor.

9. A semiconductor device having a large number of unit cells on a semiconductor substrate, the unit cells being arranged along rows and columns of the semiconductor substrate, characterized in that each said unit cell is comprised of a first MOS transistor of a first conductivity type, a first MOS transistor of a second conductivity type, a second MOS transistor of said first conductivity type, a second MOS transistor of said second conductivity type, and a third MOS transistor of said second conductivity type so that each unit cell has more transistors of said second conductivity type than of said first conductivity type, wherein the gates of said first MOS transistors of said first and second conductivity types are commonly connected to each other and wherein the gates of said second MOS transistors of said first and second conductivity types are not commonly connected to each other, and interconnecting lines being distributed on the semiconductor substrate, said interconnecting lines being selectively distributed adjacent to the unit cells so that a variety of functional circuits can be obtained by suitably utilizing one or more of the unit cells.

10. A semiconductor integrated circuit device according to claim 2 wherein said first unit cells are arranged such that sub-cells defined by evenly dividing said first unit cells by a line normal to said first unit cell lines are line symmetric with respect to the direction of said first unit cell lines.

11. A semiconductor integrated circuit device according to claim 2 wherein said first unit cells are arranged such that sub-cells defined by evenly dividing said first unit cells by a line normal to said first unit cell lines are line symmetric with respect to the direction normal to said first unit cell lines.

12. A semiconductor integrated circuit device according to claim 5 wherein said second unit cells are arranged such that sub-cells defined by evenly dividing said second unit cells by a line normal to said second unit cell lines are line symmetric with respect to the direction of said second unit cell lines.

13. A semiconductor integrated circuit device according to claim 5 wherein said second unit cells are arranged such that sub-cells defined by evenly dividing said second unit cells by a line normal to said second unit cell lines are line symmetric with respect to the direction normal to said second unit cell lines.

* * * * *